United States Patent
Tsai et al.

(10) Patent No.: US 8,552,495 B2
(45) Date of Patent: Oct. 8, 2013

(54) DUMMY GATE FOR A HIGH VOLTAGE TRANSISTOR DEVICE

(75) Inventors: Yung-Chih Tsai, Jhudong Town (TW); Han-Chung Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 320 days.

(21) Appl. No.: 12/910,000

(22) Filed: Oct. 22, 2010

(65) Prior Publication Data

US 2012/0098063 A1 Apr. 26, 2012

(51) Int. Cl.
*H01L 29/66* (2006.01)
*H01L 21/336* (2006.01)

(52) U.S. Cl.
USPC ............ 257/339; 257/E29.255; 257/E21.409; 438/286

(58) Field of Classification Search
None
See application file for complete search history.

(56) References Cited

U.S. PATENT DOCUMENTS 7,718,494 B2 * 5/2010 Tsai et al. ............. 438/275
2011/0193161 A1 * 8/2011 Zhu et al. ............. 257/343

OTHER PUBLICATIONS

Unpublished U.S. Appl. No. 12/701,656, "Method and Apparatus for Forming a Gate" filed Feb. 8, 2010.
Unpublished U.S. Appl. No. 12/719,720, "Method and Apparatus for Forming ESD Protection Device" filed Mar. 8, 2010.

* cited by examiner

*Primary Examiner* — Fernando L Toledo
*Assistant Examiner* — Valerie N Newton
(74) *Attorney, Agent, or Firm* — Haynes and Boone, LLP

(57) ABSTRACT

The present disclosure provides a semiconductor device. The semiconductor device includes a first doped region and a second doped region both formed in a substrate. The first and second doped regions are oppositely doped. The semiconductor device includes a first gate formed over the substrate. The first gate overlies a portion of the first doped region and a portion of the second doped region. The semiconductor device includes a second gate formed over the substrate. The second gate overlies a different portion of the second doped region. The semiconductor device includes a first voltage source that provides a first voltage to the second gate. The semiconductor device includes a second voltage source that provides a second voltage to the second doped region. The first and second voltages are different from each other.

20 Claims, 8 Drawing Sheets

US 8,552,495 B2

DUMMY GATE FOR A HIGH VOLTAGE TRANSISTOR DEVICE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

The constantly decreasing geometry size leads to challenges in fabricating high voltage semiconductor transistor devices. These high voltage transistor devices may need a sufficiently large voltage drop from a gate of the transistor device to a drain region of the transistor device. Traditionally, the large voltage drop has been accomplished by pushing the drain region away from the gate and source region, effectively lengthening the drain region. However, as transistor device sizes become smaller, it becomes impractical to lengthen the drain region.

Therefore, while existing methods of fabricating high voltage transistors have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
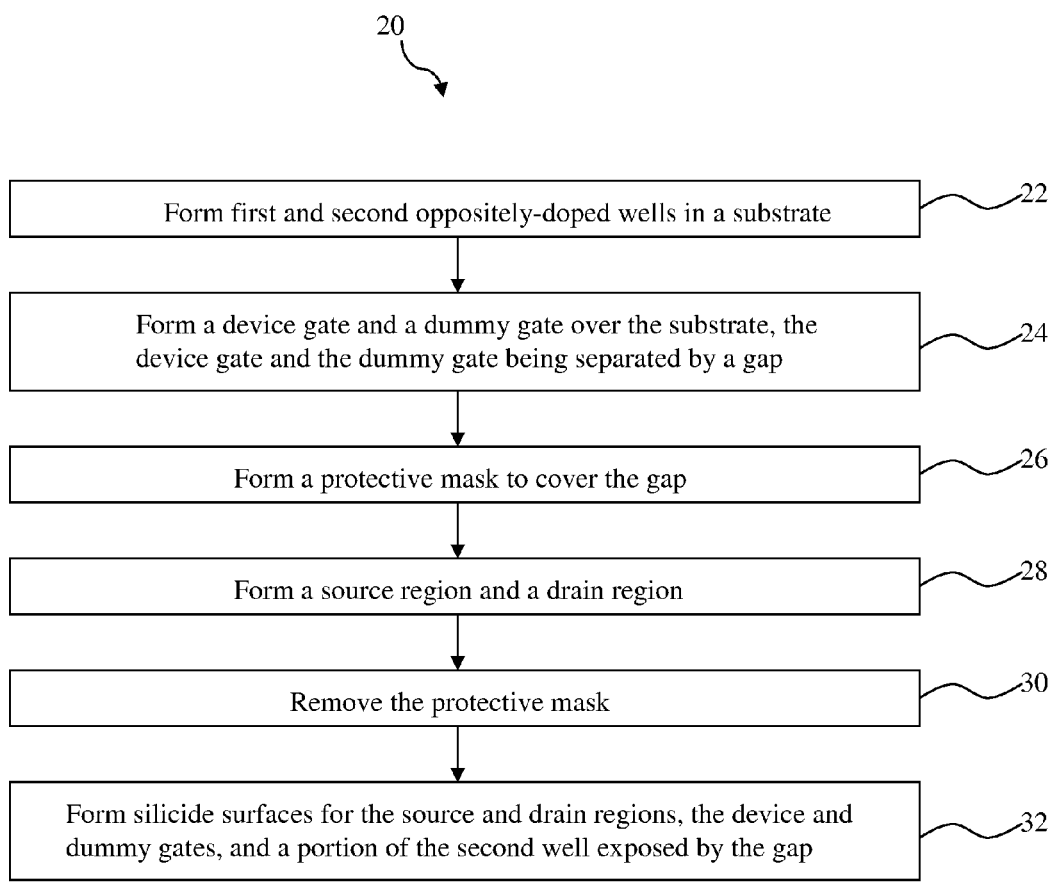
FIG. 1 is a flowchart illustrating a method of forming a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 20 for fabricating a semiconductor device. The method 20 begins with block 22 in which first and second oppositely-doped wells are formed in a substrate. The method continues with block 24 in which a device gate and a dummy gate are formed over the substrate. The device gate is formed over the first and second wells. The dummy gate is formed over the second well. The first and second wells are separated by a gap. The method continues with block 26 in which a protective mask is formed to cover the gap between the first and second wells. The method continues with block 28 in which a source region and a drain region are formed. The source and drain regions have the same doping polarity. The source region is formed in a portion of the first well not protected by the device gate. The drain region is formed in a portion of the second well not protected by the dummy gate and the protective mask. The method continues with block 30 in which the protective mask is removed. The method continues with block 32 in which silicide surfaces are formed for the source and drain regions, the device gate, the dummy gate, and a portion of the second well exposed by the gap.

Figure 7:
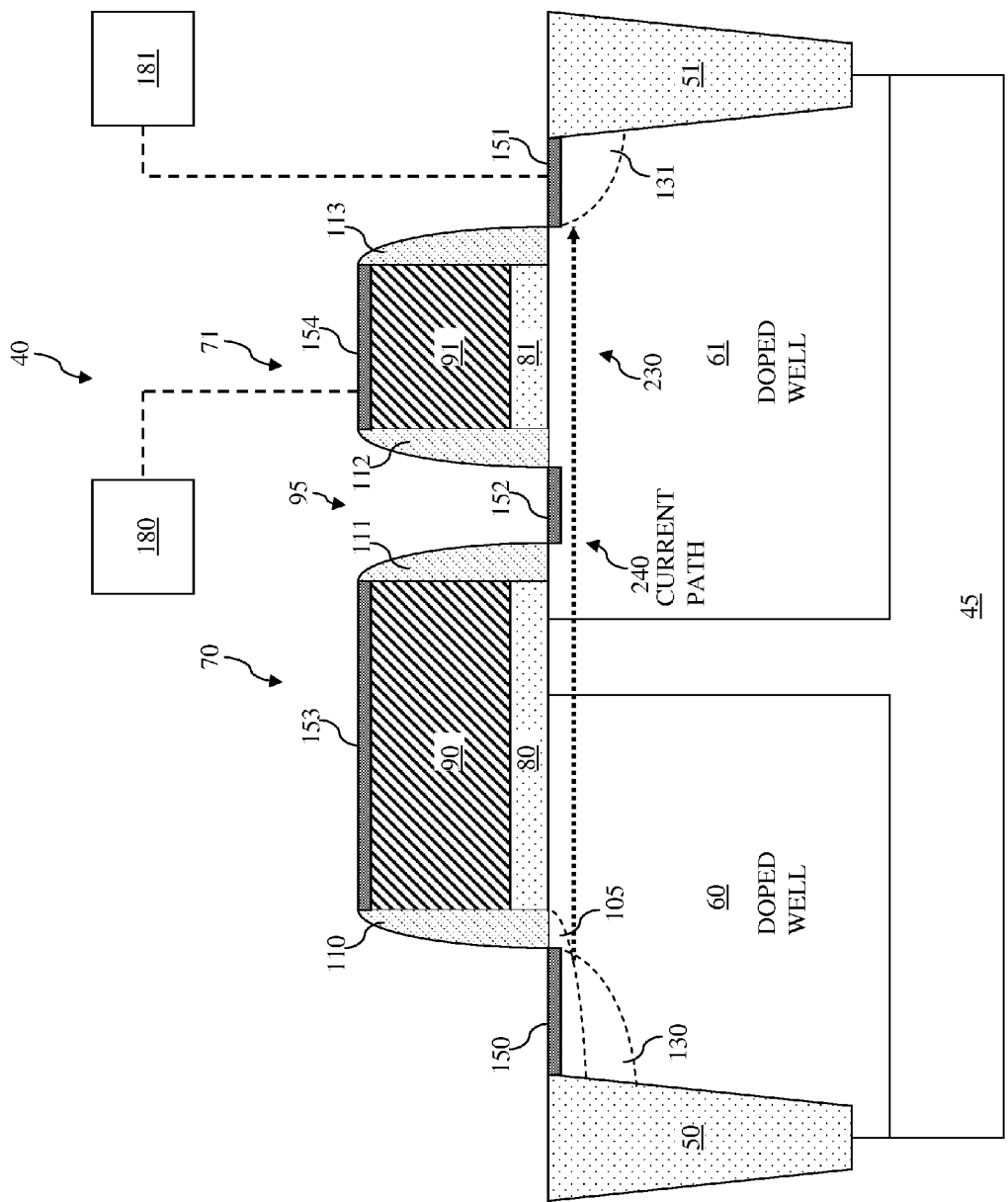
FIGS. 7 and 8 are diagrammatic fragmentary cross-sectional side views of a semiconductor device at a stage of fabrication in accordance with respective alternative embodiments of the present disclosure.
Figure 8:
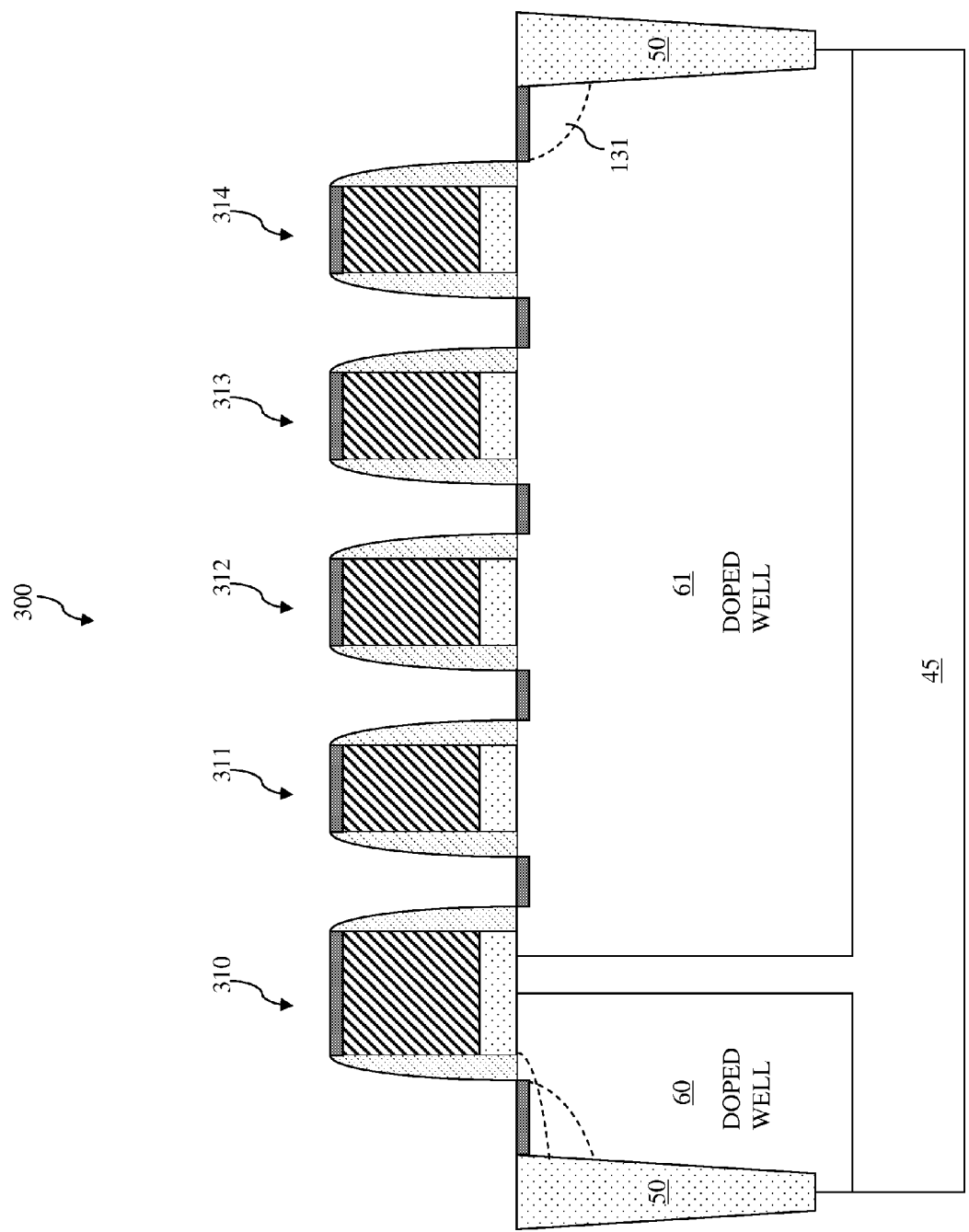

FIGS. 2-6 are diagrammatic fragmentary cross-sectional side views of a high voltage transistor device at various stages of fabrication in accordance with various aspects of the present disclosure. FIGS. 7 and 8 are respective diagrammatic fragmentary cross-sectional side views of a high voltage transistor device at a stage of fabrication in accordance with alternative embodiments of various aspects of the present disclosure. It is understood that FIGS. 2-8 have been simplified for a better understanding of the inventive concepts of the present disclosure. Accordingly, it should be noted that additional processes may be provided before, during, and after the processes shown in FIGS. 2-8, and that some other processes may only be briefly described herein.

Figure 2:
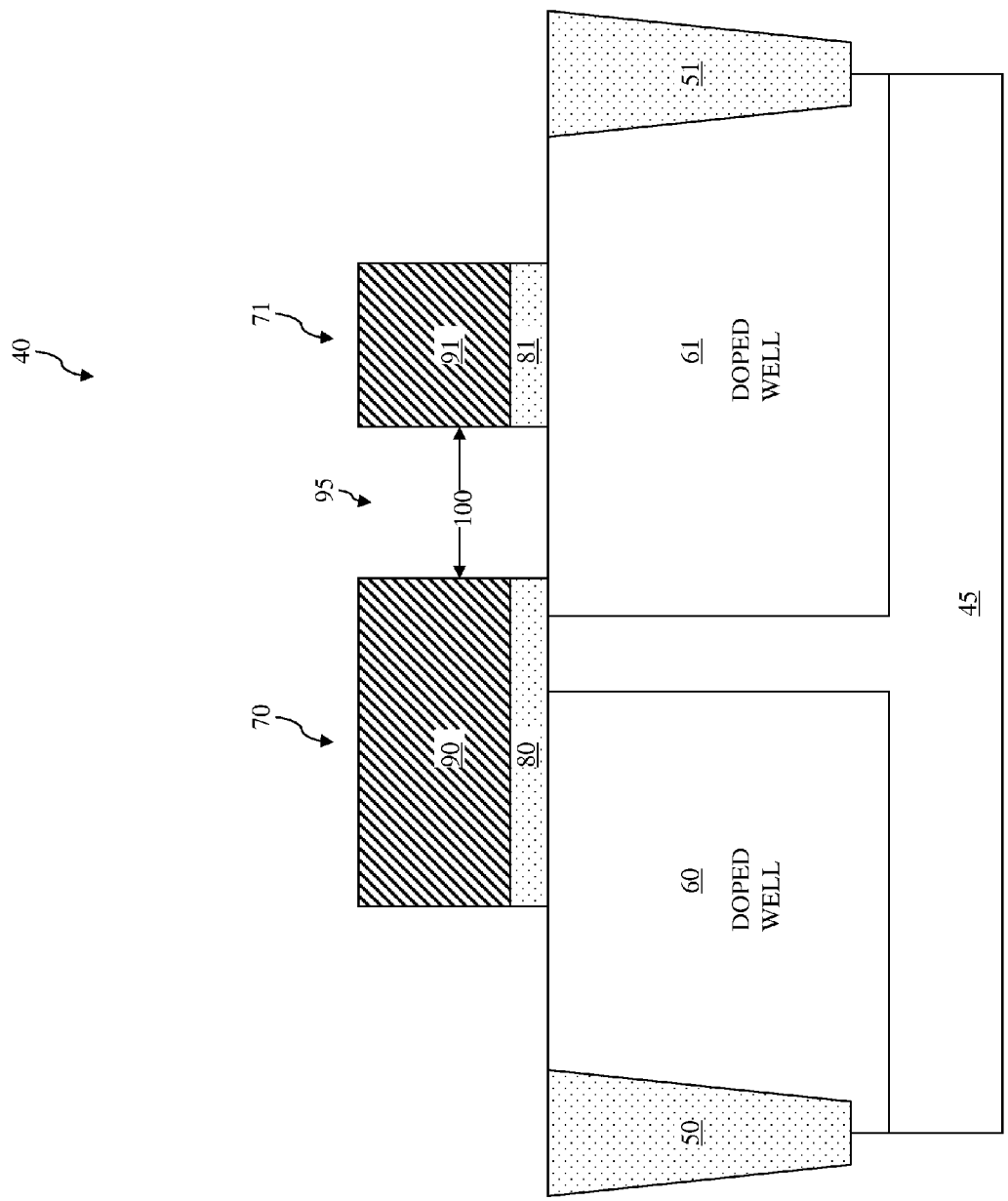
FIGS. 2-6 are diagrammatic fragmentary cross-sectional side views of a semiconductor device at various stages of fabrication in accordance with an embodiment of the present disclosure.

Referring to FIG. 2, the high voltage semiconductor transistor device is a high voltage N-type MOS transistor (HV NMOS) 40 in an embodiment. It is understood that the following discussions may also apply to a high voltage P-type transistor (HV PMOS), for example by reversing the appropriate doping polarities. For the sake of simplicity, however, only the HV NMOS is discussed below. Referring back to FIG. 2, the HV NMOS transistor includes a substrate 45. The substrate 45 is a silicon substrate that is doped with a P-type dopant such as boron.

Isolation structures 50 and 51 are formed in the substrate 45. In an embodiment, the isolation structures 50 and 51 are shallow trench isolation (STI) structures that each include a dielectric material. The dielectric material may be silicon oxide or silicon nitride. In between the isolation structures 50 and 51, doped wells 60 and 61 are formed in the substrate 45. The doped well 60 is doped with a P-type dopant such as boron, and the doped well 61 is doped with an N-type dopant such as arsenic or phosphorous. The doped well 61 may also be referred to as an N-drift region.

In alternative embodiments where a HV PMOS transistor is formed instead of the HV NMOS transistor 40, a deep N-well is formed in the substrate, and the wells 60-61 are formed in the deep N-well but with reversed doping polarities—the well 60 would be doped with an N-type dopant, and the well 61 would be doped with a P-type dopant.

Referring back to FIG. 2, gate stacks 70 and 71 are formed over the substrate 45. The gate stacks 70 and 71 include respective gate dielectric layers 80 and 81. In an embodiment, the gate dielectric layers 80 and 81 each include silicon oxide. The gate stacks 70 and 71 also include respective gate electrode layers 90 and 91 that are respectively disposed over the gate dielectric layers 80 and 81. The gate electrode layers 90 and 91 each include a polysilicon material.

As FIG. 2 illustrates, the gate stack 70 is formed over a portion of the doped well 60 as well as a portion of the doped well 61. The gate stack 71 is formed over a portion of the doped well 61. The gate stack 71 serves as a dummy gate for reasons that will be discussed below. The gate stacks 70 and 71 are separated by a gap 95. In other words, the gate stacks 70 and 71 are spaced apart by a distance 100.

Figure 3:
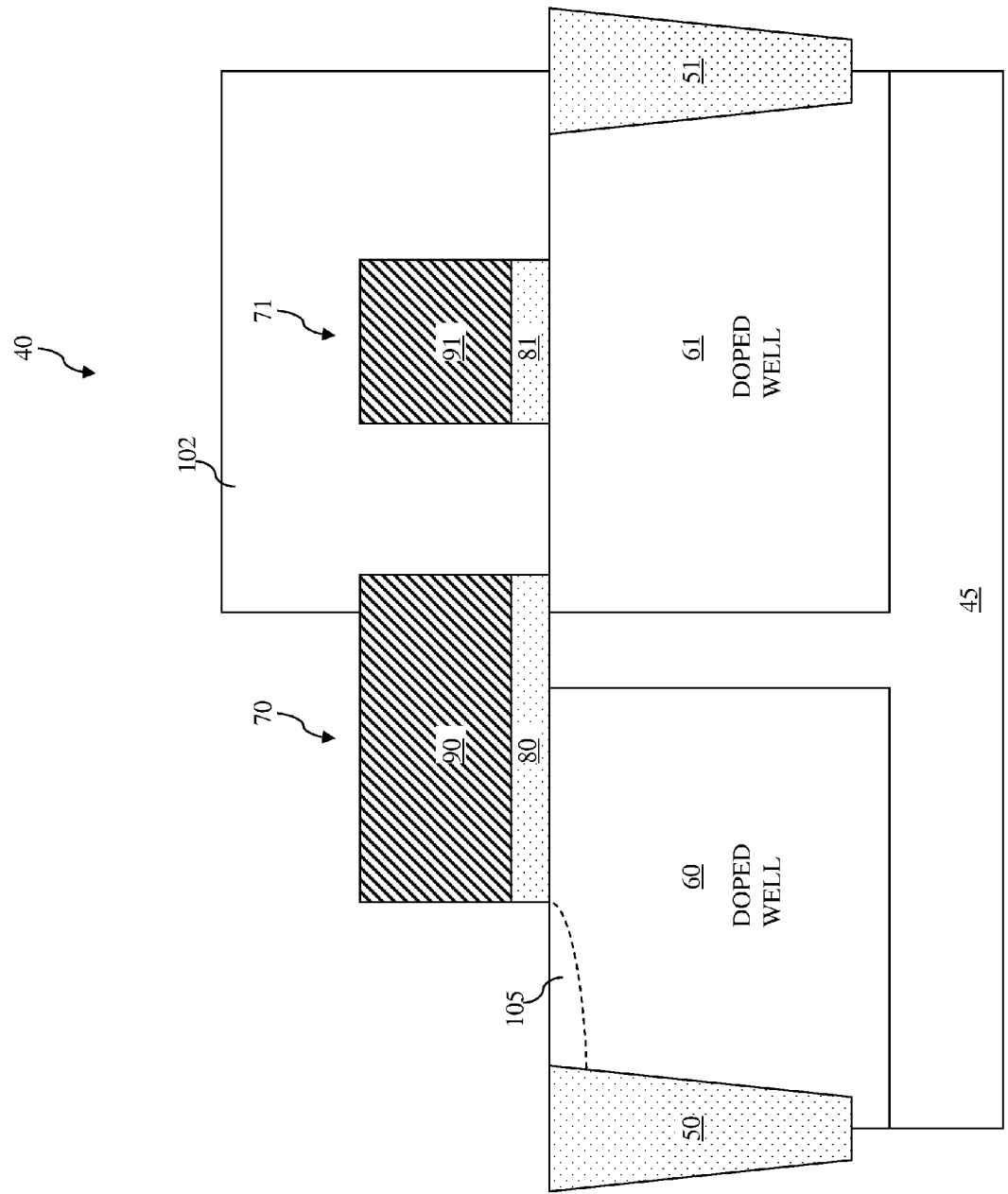

Referring now to FIG. 3, a photoresist mask 102 is formed to protect the doped well 61 from being implanted. The photoresist mask 102 is formed through a photolithography process known in the art, for example by forming a photoresist layer and patterning the photoresist layer into the photomask 102. An ion implantation process is thereafter performed to form a lightly doped source region 105 in the doped well 60. The gate stack 70 also serves as a protective mask during the ion implantation process and protects portions of the doped well 60 therebelow from being implanted. Since the present embodiment illustrates a HV NMOS device, the lightly doped source region 105 is doped with an N-type dopant such as arsenic or phosphorous.

Figure 4:
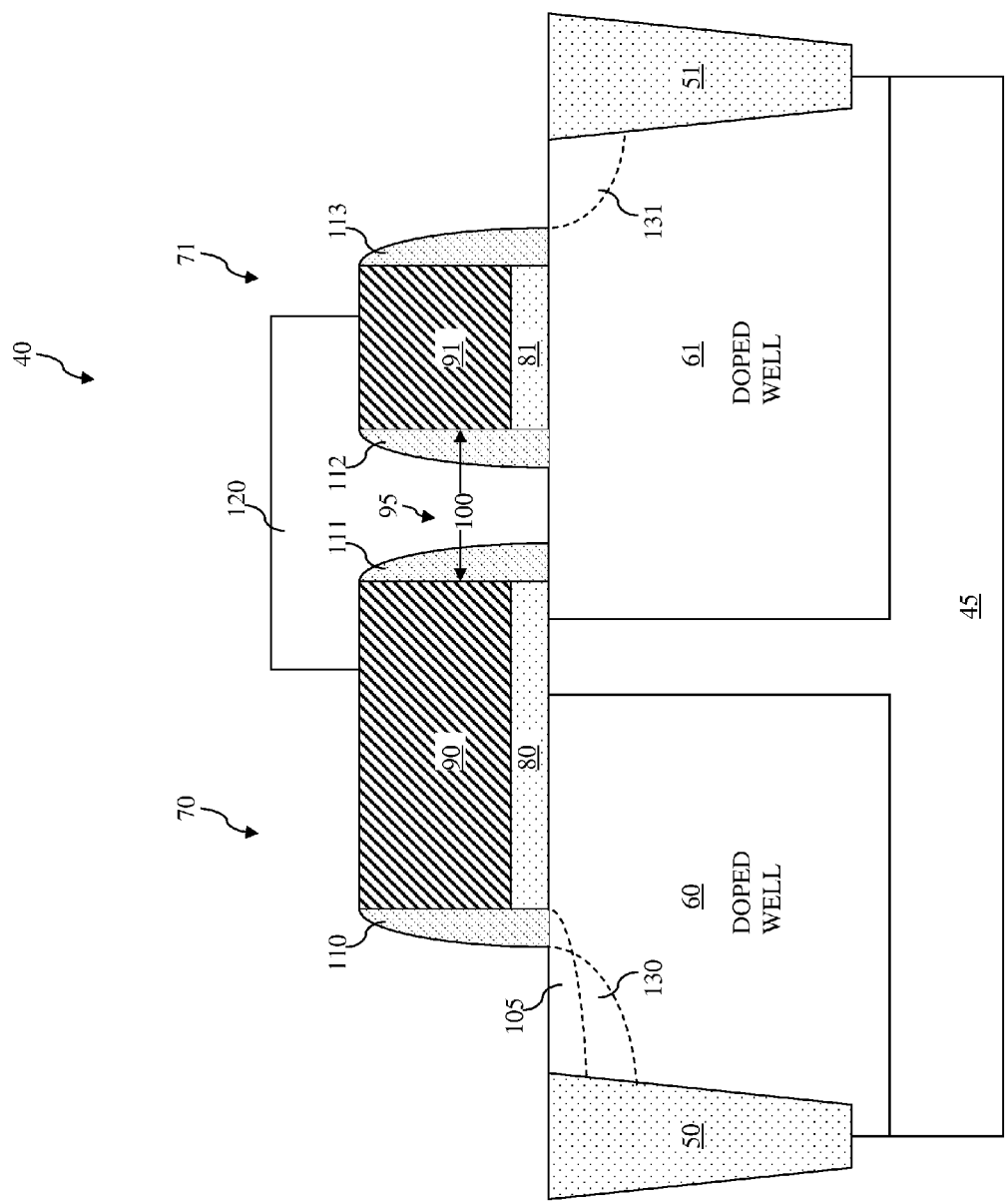

Referring now to FIG. 4, the photoresist mask 102 is removed in an ashing or stripping process known in the art. Gate spacers 110 and 111 are then formed on sidewalls of the gate stack 70, and gate spacers 112 and 113 are formed on sidewalls of the gate stack 71. The gate spacers 110 and 111 may also be considered to be a part of the gate stack 70, and the gate spacers 112 and 113 may also be considered to be a part of the gate stack 71. The gate spacers 110-113 are formed using a deposition process and an etching process (for example, an anisotropic etching process) known in the art. The gate spacers 110-113 include a suitable dielectric material such as silicon nitride, silicon oxide, silicon carbide, silicon oxy-nitride, or combinations thereof.

Thereafter, a photoresist mask 120 is formed to cover a portion of each of the gate stacks 70 and 71. The photoresist mask 120 is formed through a photolithography process known in the art. As is shown in FIG. 3, the photoresist mask 120 also fills the gap 95. One purpose of the photoresist mask 120 is to protect regions of the doped well 61 underneath the gap 95 from being doped in a later implantation process.

A heavily doped source region 130 and a heavily doped drain region 131 are formed in the doped well 60 and the doped well 61, respectively. The heavily doped source and drain regions 130 and 131 may be formed by an ion implantation process or a diffusion process known in the art. The source and drain regions 130 and 131 may also be referred to as active regions. The source and drain regions 130 and 131 have the same doping polarity as the doped well 61. Thus, for a HV NMOS, the source and drain regions 130-131 are each doped with an N-type dopant such as arsenic or phosphorous.

Since the dopants cannot penetrate through the gate stacks 70 and 71 and the spacers 110-113 around the gate stacks, the source region 130 is formed to be self-aligned with the gate spacer 110 of the gate stack 70, and the drain region 131 is formed to be self-aligned with the gate spacer 113 of the gate stack 71. In this manner, the dummy gate stack 71 helps "push out" the drain region 131 away from the source region 130.

Traditional methods of forming a high voltage transistor device do not include the forming of the gate stack 71. As such, the traditional methods rely on using a photoresist mask to accurately define an area of the drain region of the high voltage transistor device. This places burdens on the photolithography process used to form the photoresist mask and may lead to undesirable results.

Here, the formation of the gate stack 71 allows the drain region 131 to be formed in a self-aligning fashion, such that the edge of the drain region is aligned with the edge of the gate spacer 113. The photoresist mask 120 is used to protect the regions of the doped well 61 below the gap region 102 from being doped but is no longer used to define the area of the drain region 131. Consequently, the overlay requirements of the photoresist mask 120 is looser—it can be formed to be a little bit wider or narrower, and that would not impact the area of the drain region 131, as long as the edges of photoresist mask 120 are formed to be "within" the gate stacks 70 and 71.

In addition, in a semiconductor fabrication process, the fabrication stage having the best overlay control is typically the stage where the gate stacks 70 and 71 are formed. In the embodiment shown in FIG. 4, the dummy gate stack 71 is used to define the area of the drain region 131. Since the overlay control is relatively good in the fabrication stage where the dummy gate stack 71 is formed, the exact area or size of the drain region 131 can be more accurately controlled than if a photoresist mask had been used to define the area of the drain region 131.

Figure 5:
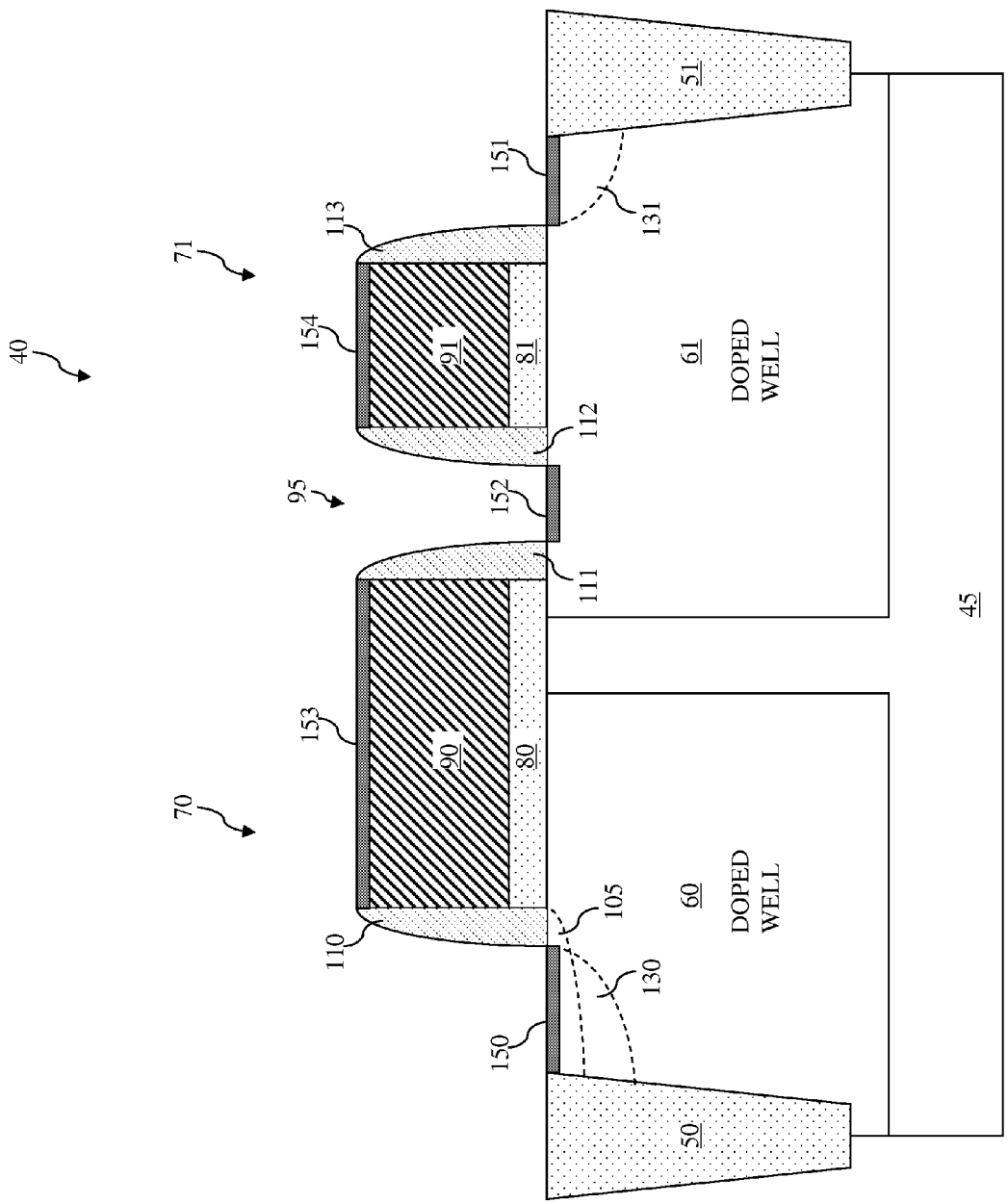

Referring now to FIG. 5, the photoresist mask 120 is removed in a stripping or ashing process known in the art. Thereafter, a silicidation process is performed on exposed surfaces of the substrate 45 to form self-aligned silicide (also referred to as salicide) elements 150-154. In more detail, the silicide element 150 is formed in the exposed surface of the source region 130; the silicide element 151 is formed in the exposed surface of the drain region 131; the silicide element 152 is formed in a surface of the region of the doped well 61 exposed by the gap 95 and in between the gate spacers 111-112; and the silicide elements 153-154 are formed in the exposed surfaces of the gate electrodes 90-91, respectively. The gate spacers 110-113 serve as protective masks in the silicidation process.

Traditional fabrication processes may require a resist protection oxide (RPO) layer to prevent the formation of the silicide elements 152-154, or may require an additional fabrication process to remove the silicide elements 152-154. Here, no extra silicide removal process is needed, and no RPO layer needs to be formed, thereby reducing fabrication costs. For the HV NMOS 40 to function as a high voltage transistor device, a relatively high voltage drop from the gate stack 70 to the drain region 131 is desired. This is one of the reasons why the drain region 131 should be pushed out from the source region 130 and from the gate stack 70, since a longer conductive path increases the resistance of the conductive path, thus effectively increasing the voltage drop.

In the embodiment shown in FIG. 5, the silicide element 152 does not affect the resistance of the conductive path very much. This is because the spacers 112 and 113 will force the current to flow through a lower dosage drift region of the doped well 61, which constitutes a high resistance path. In other words, the silicide element 152 is effectively coupled in series with the low dosage high resistance path of the drift region. It is known that when two resistive elements are coupled in series, the element having the higher resistance dominates the total resistance. Therefore, the high resistance path of the drift region will dominate the total resistance, and any contribution to the total resistance by the silicide element 152 is negligible. Stated differently, the fact that the silicide element 152 may have a low resistance will not negatively affect the performance of the HV NMOS 40. As such, no extra fabrication processes need to be performed to prevent the formation of the silicide element 152.

In addition, had an RPO layer been formed (as in traditional methods), that RPO layer would have covered at least a portion of the gate stack 70. Thus, any silicide elements formed over the gate stack 70 would have only been a partial silicide element, because the portion of the gate stack covered by the RPO layer would not have been silicided. Such partially silicided gate surface would have resulted in poor performance for the HV NMOS 40 under high-frequency (such as radio-frequency, or RF) conditions. Here, since no RPO layer is formed, the gate stack 70 has an entire silicided surface. Therefore, the gate stack 70 can achieve better high-frequency performance.

Figure 6:
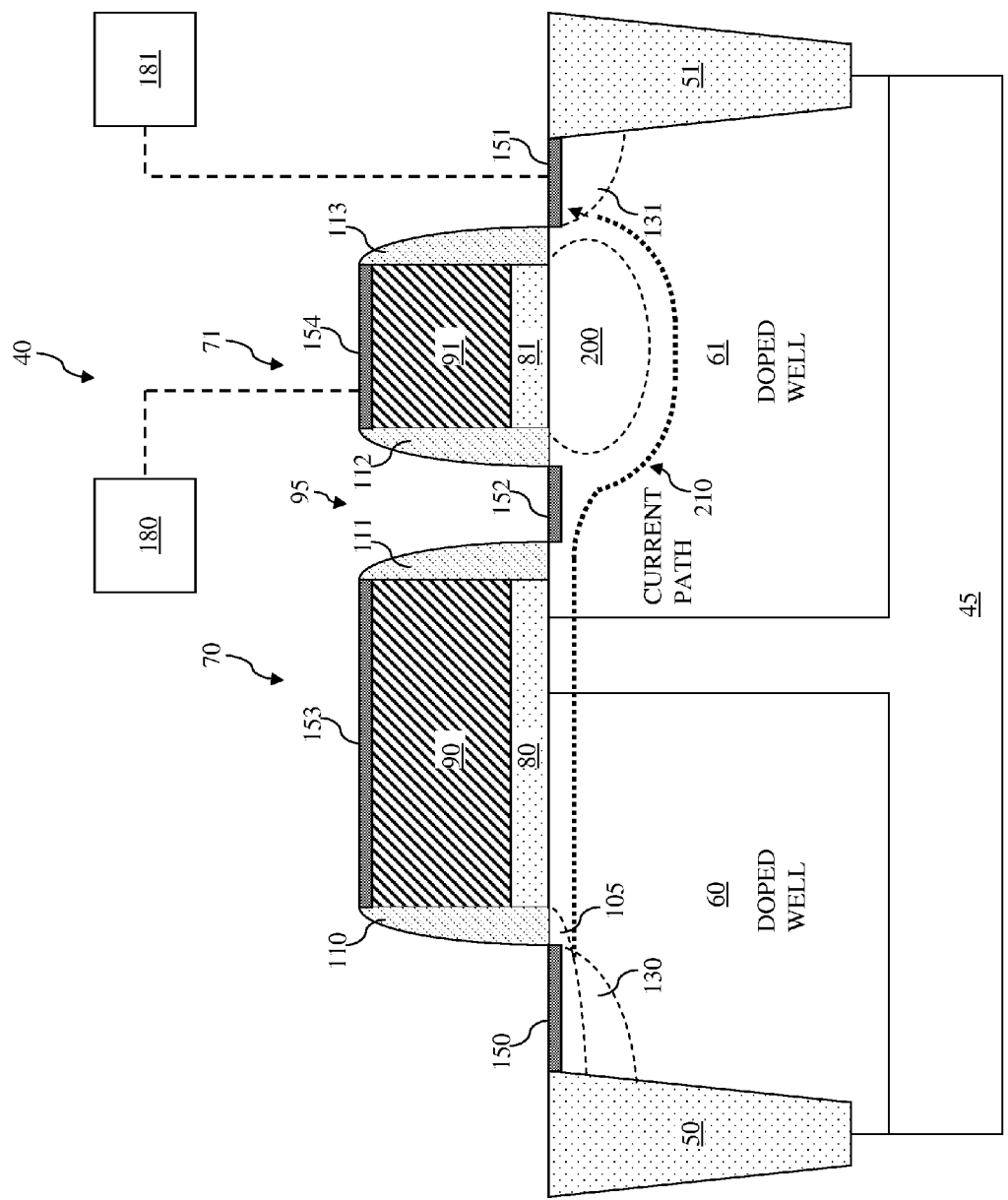

Referring now to FIG. 6, the gate stack 71 is coupled to a voltage source 180 (through the silicide element 154), and the drain region 131 is coupled to a voltage source 181 (through the silicide element 151). In other words, the voltage sources 180-181 are operable to bias the gate stack 71 and the drain region 131 to different voltages. The voltage sources 180-181 may be components within an integrated circuit chip in which the HV NMOS 40 is located. For example, the voltage sources 180-181 may be a power supply such as Vdd line, or an electrical ground line. The voltage sources 180-181 may also be voltage-divided power supplies or may be coupled to voltage-divided power supplies. In some embodiments, the voltage sources 180-181 also be portions of other transistor devices, for example other HV NMOS or HV PMOS devices.

In one embodiment, the HV NMOS 40 is at an off-state. The voltage source 180 biases the gate stack 71 to have a lower voltage than the drain region 131. For example, the voltage source 180 may be coupled to a ground line, and the voltage source 181 may be coupled to a power line. As a result, a depletion region 200 is formed underneath the gate stack 71 in the doped well 61. The dimensions or size of the depletion region 200 is correlated with the bias voltage difference between the gate stack 71 and the drain region 151.

The depletion region 200 is substantially free of charge carriers, thus leaving none to carry an electrical current. Thus, due to the presence of the depletion region 200, a current path 210—the path of current flow from the source region 130 to the drain region 131—is extended in a manner so that the current flows "around" the depletion region 200. The extended current path 210 effectively increases a resistance of a resistive path between the source region 130 and the drain region 131. A portion of a gate-drain voltage (Vgd) is allocated to the resistive path between the source region 130 and the drain region 131. In other words, the resistive path acts as a voltage drop in the channel region.

To optimize the performance of the HV NMOS 40, including to improve its time-dependent dielectric breakdown (TDDB) capability, it is desirable to allocate a greater portion of the Vgd to this resistive path (or to have a greater voltage drop), which may be accomplished by increasing the resistance of the resistive path. Existing technologies increase the resistance of the resistive path by "moving" the drain region 131 further away from the source region 130, which increases the size of the HV NMOS 40 and is therefore undesirable. In comparison, the embodiment illustrated in FIG. 6 offers the advantage of increased resistance of the resistive path without having to increase the size of the HV NMOS 40.

FIG. 7 illustrates an embodiment of the HV NMOS 40 when the HV NMOS 40 is at an on-state. In this case, it is desirable to improve the electrical current (such as Id_sat and Id_linear) performance of the HV NMOS 40 by forming an accumulation region 230 underneath the gate stack 71 in the doped well 61. The accumulation region 230 is formed by biasing the gate stack 71 to a higher voltage than the drain region 131. The formation of the accumulation region 230 also corresponds to a straighter current path 240 from the source region 130 to the drain region 131.

FIG. 8 illustrates a HV NMOS 300 that is similar to the HV NMOS 40 discussed above and illustrated in FIGS. 2-7. For purposes of consistency and clarity, some of the similar elements are labeled the same in FIG. 8 as they were in FIGS. 2-7. The HV NMOS 300 is formed using substantially similar processes that were used to form the HV NMOS 40. The HV NMOS 300 includes a device gate stack 310 that is similar to the gate stack 70. The HV NMOS 300 also includes a plurality of dummy gate stacks that are similar to the gate stack 71. For the sake of simplicity, four of such dummy gate stacks 311-314 are shown in FIG. 8, though it is understood that any number of these dummy gate stacks may be formed.

As was the case for the HV NMOS 40, the dummy gate stacks 311-314 help push out the drain region 131 and effectively increases the resistance of a current path when the HV NMOS 40 is at an off-state. Also, similar to the case shown in FIGS. 6-7, each of the dummy gate stacks 311-314 may be biased to a voltage that is different from the voltage biased to the drain region 131. Thus, multiple depletion regions or accumulation regions may be formed underneath the dummy gate stacks 311-314, depending on the needs of the HV NMOS 300.

The various embodiments of the present disclosure offer advantages, it being understood that different embodiments may offer different advantages, and that no particular advantage is required for all embodiments. One of the advantages is that the dummy gate stack(s) can effectively "push out" the drain region away from the source region and the device gate, thereby increasing the resistance of the conductive path when that is desired. Another advantage is that the use of the dummy gate stack(s) relaxes the stringent overlay requirements associated with existing technologies. One more advantage is that since there is no longer a need to form an RPO layer to prevent silicide formation, fabrication processes are simplified and fabrication costs are reduced. Also, the device gate can now have a completely silicided surface, which offers a better high-frequency performance. Yet another advantage is that since the dummy gate stack(s) and the drain regions are actively biased to different voltages through different voltage sources, either a depletion region or an accumulation region may be formed below the dummy gate stack. Thus, the biasing scheme of the present disclosure offers flexibility to suit different needs.

It is understood that additional processes may be performed to complete the fabrication of the HV NMOS 40. For example, these additional processes may include formation of an interconnect structure (e.g., lines and vias, metal layers, and interlayer dielectric that provide electrical interconnection to the transistors such as the HV NMOS 40), deposition of passivation layers, and packaging. For the sake of simplicity, these additional processes are not described herein.

One of the broader forms of the present disclosure involves a semiconductor device. The semiconductor device includes: a first doped region and a second doped region both formed in a substrate, the first and second doped regions being oppositely doped; a first gate formed over the substrate, the first gate overlying a portion of the first doped region and a portion of the second doped region; a second gate formed over the substrate, the second gate overlying a different portion of the second doped region; a first voltage source that provides a first voltage to the second gate; and a second voltage source that provides a second voltage to the second doped region; wherein the first and second voltages are different from each other.

Another of the broader forms of the present disclosure involves a semiconductor device. The semiconductor device includes: a first doped well and a second doped well each formed in a substrate, one of the first and second doped wells being doped with a P-type dopant, and the other one of the first and second doped wells being doped with an N-type dopant; a device gate structure disposed partially over the first and second doped wells, the device gate structure including a polysilicon gate electrode, wherein an entire upper surface of the gate electrode is silicided; and a dummy gate structure disposed over the second doped well, the dummy gate structure being separated from the device gate structure by a gap, wherein a region of the second doped well underneath the gap has a silicided surface.

Still another of the broader forms of the present disclosure involves a method of fabricating a semiconductor device. The method includes: forming first and second oppositely-doped wells in a substrate; forming a device gate and a dummy gate over the substrate, the device gate being formed over the first and second wells, the dummy gate being formed over the second well, the first and second wells being separated by a gap; forming a protective mask to cover the gap between the first and second wells; forming a source region and a drain region having the same doping polarity as the source region, the source region being formed in a portion of the first well not protected by the device gate, the drain region being formed in a portion of the second well not protected by the dummy gate and the protective mask; removing the protective mask; and forming silicide surfaces for the source region, the drain region, the device gate, the dummy gate, and a portion of the second well exposed by the gap.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the high voltage device may not be limited to an NMOS device and can be extended to a PMOS device with a similar structure and configuration except that all doping types may be reversed and dimensions are modified according to PMOS design. Further, the PMOS device may be disposed in a deep doped well pocket for isolating the device.

What is claimed is:

1. A semiconductor device, comprising:
   a first doped region and a second doped region both formed in a substrate, the first and second doped regions being oppositely doped;
   a first gate formed over the substrate, the first gate overlying a portion of the first doped region and a portion of the second doped region;
   a second gate formed over the substrate, the second gate overlying a different portion of the second doped region;
   a first voltage source that provides a first voltage to the second gate; and
   a second voltage source that provides a second voltage to the second doped region;
   wherein the first and second voltages are different from each other.

2. The semiconductor device of claim 1, wherein the first and second voltage sources are operable to cause the first voltage to be smaller than the second voltage in a manner so that a depletion region is formed in the second doped region underneath the second gate.

3. The semiconductor device of claim 1, wherein the first and second voltage sources are operable to cause the first voltage to be greater than the second voltage in a manner so that an accumulation region is formed in the second doped region underneath the second gate.

4. The semiconductor device of claim 1, wherein one of the first and second voltage sources is coupled to a power supply, and the other one of the first and second voltage sources is coupled to an electrical ground.

5. The semiconductor device of claim 1, wherein:
   the first doped region includes a first heavily doped portion that constitutes a source region of a transistor;
   the second doped region includes a second heavily doped portion that constitutes a drain region of the transistor, the first and second heavily doped portions each being doped with the same doping polarity as the second doped region; and
   the first gate constitutes a gate of the transistor.

6. The semiconductor device of claim 1, wherein the first gate has a completely silicided upper surface.

7. The semiconductor device of claim 1, wherein a portion of the second doped region between the first and second gates has a silicided surface.

8. The semiconductor device of claim 1, wherein the first and second gates each include a polysilicon material.

9. The semiconductor device of claim 1, further including a third gate formed over the second doped region.

10. A semiconductor device, comprising:
    a first doped well and a second doped well each formed in a substrate, one of the first and second doped wells being doped with a P-type dopant, and the other one of the first and second doped wells being doped with an N-type dopant;
    a device gate structure disposed partially over the first and second doped wells, the device gate structure including a polysilicon gate electrode, wherein an entire upper surface of the gate electrode is silicided; and
    a dummy gate structure disposed over the second doped well, the dummy gate structure being separated from the device gate structure by a gap, wherein a region of the second doped well underneath the gap has a silicided surface.

11. The semiconductor device of claim 10, wherein:
    the first doped well includes a first portion therein that has a higher doping concentration than the first and second doped wells, the first portion serving as a source region of a transistor;
    the second doped well includes a second portion therein that has a higher doping concentration than the first and second doped wells, the second portion serving as a drain region of the transistor, wherein the first and second portions having the same doping polarity; and
    the device gate structure serves as a gate of the transistor.

12. The semiconductor device of claim 11, wherein the dummy gate structure is charged to a lower voltage than the drain region of the transistor so as to cause a depletion region to be formed within the second doped well.

13. The semiconductor device of claim 11, wherein the dummy gate structure is charged to a higher voltage than the drain region of the transistor so as to cause an accumulation region to be formed within the second doped well.

14. The semiconductor device of claim 11, further including: a plurality of additional dummy gate structures disposed over the second doped well.

15. The semiconductor device of claim 14, wherein each of the additional dummy gate structures is charged to a different voltage from the drain region of the resistor.

16. A method of fabricating a semiconductor device, comprising:
    forming first and second oppositely-doped wells in a substrate;
    forming a device gate and a dummy gate over the substrate, the device gate being formed over the first and second wells, the dummy gate being formed over the second well, the first and second wells being separated by a gap;
    forming a protective mask to cover the gap between the first and second wells;
    forming a source region and a drain region having the same doping polarity as the source region, the source region being formed in a portion of the first well not protected by the device gate, the drain region being formed in a portion of the second well not protected by the dummy gate and the protective mask;
    removing the protective mask; and
    forming silicide surfaces for the source region, the drain region, the device gate, the dummy gate, and a portion of the second well exposed by the gap.

17. The method of claim 16, wherein the device gate and the dummy gate each include a polysilicon gate electrode.

18. The method of claim 16, wherein the forming the silicide surfaces is carried out in a manner so that an entire upper surface of the device gate is silicided.

19. The method of claim 16, further including:
    biasing the dummy gate to a first voltage; and
    biasing the drain region to a second voltage different from the first voltage.

20. The method of claim 16, further including: forming a plurality of additional dummy gates over the second well.

* * * * *